(12) United States Patent
Hino et al.

(10) Patent No.: US 6,224,674 B1
(45) Date of Patent: May 1, 2001

(54) SEAL COATING MASK FOR SEMICONDUCTOR ELEMENT AND METHOD OF USE THEREOF

(75) Inventors: Hirohisa Hino, Hirakata; Taro Fukui, Osaka; Kenji Kitamura, Moriguchi, all of (JP)

(73) Assignee: Matsushita Electric Works, Ltd., Osaka (JP)

( * ) Notice: Subject to any disclaimer, the term of this patent is extended or adjusted under 35 U.S.C. 154(b) by 0 days.

(21) Appl. No.: 09/317,616

(22) Filed: May 25, 1999

(30) Foreign Application Priority Data

May 29, 1998 (JP) .................................. 10-150456
Aug. 25, 1998 (JP) .................................. 10-239263

(51) Int. Cl.$^7$ .................................................. B05C 17/06
(52) U.S. Cl. ........................................... 118/505; 427/282
(58) Field of Search ............................. 427/272, 282; 118/213, 301, 406, 504, 505, 721; 228/39, 248.1, 56.3; 101/127

(56) References Cited

U.S. PATENT DOCUMENTS 5,232,651   8/1993   Okuno et al. .

FOREIGN PATENT DOCUMENTS

| 1201819 | 3/1986 | (CA) . |
| 0130552 | 1/1985 | (EP) . |
| 3-181142 | 8/1991 | (JP) . |
| 6-95594 | 11/1994 | (JP) . |
| 28007838 | 7/1998 | (JP) . |

*Primary Examiner*—Laura Edwards
(74) *Attorney, Agent, or Firm*—Greenblum & Bernstein, P.L.C.

(57) ABSTRACT

Seal coating mask for semiconductor element and method of use thereof with a seal coating mask with an opening located at a position where a semiconductor element is mounted on a wiring board. The coating mask has an annular protrusion formed along the whole periphery of the opening. A clearance of about 0.01 to 0.5 mm is formed between at least a part of the whole periphery of the annular protrusion and the front surface of the wiring board. The coating mask also includes a space portion formed on the back of the seal coating mask for cutting off cooling material outside of the annular protrusion. The coating mask is used to forcibly coat a material for sealing the semiconductor element in the front surface of the wiring board.

21 Claims, 16 Drawing Sheets

SEAL COATING MASK FOR SEMICONDUCTOR ELEMENT AND METHOD OF USE THEREOF

CROSS-REFERENCE TO RELATED APPLICATIONS

The present application claims priority under 35 U.S.C. § 119 of Japanese Patent Application Nos. 10-150456, filed May 29, 1998, and 10-239263, filed Aug. 8, 1998, the disclosures of which are expressly incorporated by reference herein in their entireties.

BACKGROUND OF THE INVENTION

1. Field of the Invention

The present invention relates to a mask conveniently used for seal coating of a semiconductor element and a method of fabricating a sealed type semiconductor device using the mask.

2. Discussion of Background Information

A semiconductor device is fabricated with a semiconductor element mounted on a wiring board. The semiconductor element is electrically connected to the wiring board with bonding wire or with bumps formed on the semiconductor. After connection to the wiring board, the semiconductor element is sealed with a sealing material.

In the sealing process, as shown in FIG. 11(a) a semiconductor element 2 is mounted on a wiring board 1. The semiconductor element 2 is electrically connected to a circuit (not shown) of the wiring board 1 by bonding wires W. After this connection, a coating mask 3', with an opening 31' located at the mounting position of semiconductor element 2 on wiring board 1, is overlaid on wiring board 1 such that semiconductor element 2 is located inside opening 31'. A sealing material 4, supplied in advance on the mask 3', is then forced in with a squeegee 5, whereby sealing material 4 is coated as a pattern on the front surface of wiring board 1 through mask opening 31'.

FIG. 11(b) shows a semiconductor device obtained after removing mask 3' from wiring board 1. When mask 3' is removed from wiring board 1, the sealing material 4, which has a viscosity, attaches to the inner peripheral surface 311' of opening 31' as shown in FIG. 12(a). Under this condition, mask 3' is removed. The sealing material 4 develops a stringiness. The stringy sealing material 4 curls onto the back suite of mask 3' as shown in FIG. 12(b). This curled portion 41 is pressed and forms a pattern on the surface of the wiring board 1 as shown in FIG. 12(c) the next time when mask 3' is used. The amount of this curled portion 41 is variable according to the position of the back peripheral edge of opening 31', and therefore the spread 42 on the front surface of the wiring board assumes an irregular pattern as shown in FIG. 12(d).

For the purpose of preventing this phenomenon, Japanese Patent document 6-95594 discloses a mask 3" formed with an annular protrusion 32" in linear contact along the whole periphery of the edge of the back of an opening 31" as shown in FIG. 13.

Also, Japanese Patent document 3-181142 discloses a space portion 33" formed outside of the annular protrusion 32" for cutting off the sealing material as shown in FIG. 14. Specifically, by forming space portion 33" on the back of the mask, the sealing material is prevented from curling around to the outside of annular protrusion 32".

FIG. 16(a) shows the method disclosed in Japanese Patent document 6-95594. When mask 3" is removed from wiring board 1 after sealing, the sealing material 4 remains attached in drips at the forward end of the annular protrusion 32". Thus, when mask 3" is set on a new wiring board 1 at the next coating session, the sealing material 4 in drips is pressed against new wiring board 1 and spreads over the surface of wiring board 1 as shown in FIG. 16(b). The size of the drips, however, is varied from one point to another of the annular protrusion (in the case where the annular protrusion is in the form of a rectangular frame, for example, the drips on the side portions are thicker than those at the corners). Therefore, the spread described above is inconsistent and irregular, and not uniform. In other words, a sediment deposit appearance develops. If the sealing material is forced in and the mask 3" is removed from wiring board 1 under this condition, the foot of the sealing material thus forced in extends over the entire irregular spread that has already expanded over the front surface of the wiring board, with the result that the foot of the sealing layer assumes an irregular jagged form and cannot be finished in an attractive manner. The recent trend of semiconductor elements is toward a higher density package, and the sealing area is strictly defined. An irregular jagged foot of the sealing layer, therefore, is liable to cause a conduction failure. For this reason, it is desirable that the drips at the forward end of the annular protrusion are prevented from spreading over the surface of the wiring board.

SUMMARY OF THE INVENTION

Accordingly, the present invention is directed to a seal coating mask for a semiconductor element and method of use thereof that substantially obviates one or more of the problems arising from the limitations and disadvantages of the related art.

It is an object of the present invention to provide a semiconductor seal coating mask and a method of use thereof, by which the sealed area is contained definitely within the design range at the time of coat sealing.

Accordingly, one aspect of the present invention is directed to a seal coating mask for a semiconductor element that includes an opening located at a position where a semiconductor element is mounted on a wiring board where an annular protrusion is formed along the whole periphery of the opening. A clearance of about 0.01 to 0.5 mm is formed between at least a part of the whole periphery of the annular protrusion and the front surface of the wiring board. A space portion is formed on the back of the seal coating mask for cutting off sealing material outside of the annular protrusion. The coating mask is used to forcibly coat a material for sealing the semiconductor element in the front surface of the wiring board.

According to another aspect of the present invention, the space portion communicates with the exterior of the seal coating mask. The space portion is not coated with the sealing material.

According to yet another aspect of the present invention, the annular protrusion is a protruded rectangular frame having the clearance at each opposed corners thereof.

In a further aspect of the present invention, the annular protrusion is formed with the clearance along the whole periphery thereof.

According to another aspect of the present invention, the annular protrusion is formed of resin.

According to still another aspect of the present invention, a leak passage extends from the space portion to the exterior of the seal coating mask.

In a further aspect of the present invention, the leak portion extends from the center of the space portion.

According to another aspect of the present invention, the leak portion extends from an edge of the space portion.

According to still another aspect of the present invention, the annular protrusion is formed of a thin eaves-shaped plate about 0.05 to 0.5 mm thick.

In a further aspect of the present invention, the forward end of the eaves are curled in.

According to another aspect of the present invention, the invention includes a method of fabricating a semiconductor device using the seal coating mask from above. The method includes mounting the semiconductor element on the wiring board. The coating mask is overlayed on the wiring board such that the semiconductor element is located inside the opening. A squeegee is used to forcibly coat sealing material onto the front surface of the wiring board through the coating mask opening in order to seal the semiconductor element onto the wiring board. The mask is then released from the wiring board.

According to yet another aspect of the present invention, a method of fabricating a semiconductor device includes reducing an ambience pressure after overlaying and restoring the ambience pressure to the atmospheric pressure after coating.

In a still further aspect of the present invention, the reduced ambience pressure is not higher than about 0.7 kPa during the coating, the coating then is repeated under a reduced pressure of not lower than about 0.7 kPa to finish coating the sealing material.

According to another aspect of the present invention, the reduced ambience pressure is not higher than about 0.7 kPa during the coating, the coating then is repeated under the atmospheric pressure to finish coating the sealing material.

According to yet another aspect of the present invention, an annular protrusion is formed along the whole periphery of the opening, a clearance of about 0.01 to 0.5 mm is formed between at least a part of the whole periphery of the annular protrusion and the front surface of the wiring board, the sealing material is forcibly coated under normal pressure.

With the mask and the method of use thereof according to the present invention, the space portion formed outside of the annular protrusion is opened to the mask exterior, and therefore, no pressure difference occurs between the interior and exterior of the annular protrusion. Also, the sealing material that has leaked out into the space portion is returned into the mask opening by way of the clearance formed in the annular protrusion. As a result, according to the present invention, the seal coating may be carried out beautifully. Further, the clearance formed in the annular protrusion may prevent the air from mixing with the sealing material layer, and therefore, voids are not easily formed in the sealing resin layer.

The sealing material may be returned comparatively uniformly over the whole periphery of the annular protrusion by forming the clearances at the opposed corners, or along the whole periphery of the annular protrusion.

After complete seal coating work, the finish coating is conducted. The sealing resin layer may thus be finished in an attractive fashion.

Other exemplary embodiments and advantages of the present invention may be ascertained by reviewing the present disclosure and the accompanying drawings.

BRIEF DESCRIPTION OF THE DRAWINGS

The present invention is further described in the detailed description which follows, in reference to the noted plurality of drawings by way of non-limiting examples of preferred embodiments of the present invention, in which like reference numerals represent similar parts throughout the several views of the drawings, and wherein:

FIG. 2($b$) is a partial side sectional view of a sealed type semiconductor device obtained by use of the mask;

FIG. 2($c$) is a partial plan view of a sealed type semiconductor device obtained by use of the mask;

FIG. 4($b$) is a side sectional view showing an example configuration of the annular protrusion of the mask where the mask is constituted of a plate material and a thin plate material overlaid thereon projected like eaves to form the annular protrusion;

FIG. 4($c$) is a side sectional view showing an example configuration of the annular protrusion of the mask where the forward end of the eaves is curled in;

FIG. 11($b$) is a partial side sectional view of a sealed-type semiconductor device obtained by use of this mask;

FIG. 12($d$) is a partial plan view showing the problem points posed when the conventional mask is used;

FIG. 15($b$) is a partial side sectional view of a sealed-type semiconductor device obtained using the mask of FIG. 14 under reduced pressure;

FIG. 16($b$) is a partial side sectional view of the mask of FIG. 16($a$) in use.

DETAILED DESCRIPTION OF THE PRESENT INVENTION

The particulars shown herein are by way of example and for purposes of illustrative discussion of the embodiments of the present invention only and are presented in the cause of providing a useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Figure 13:
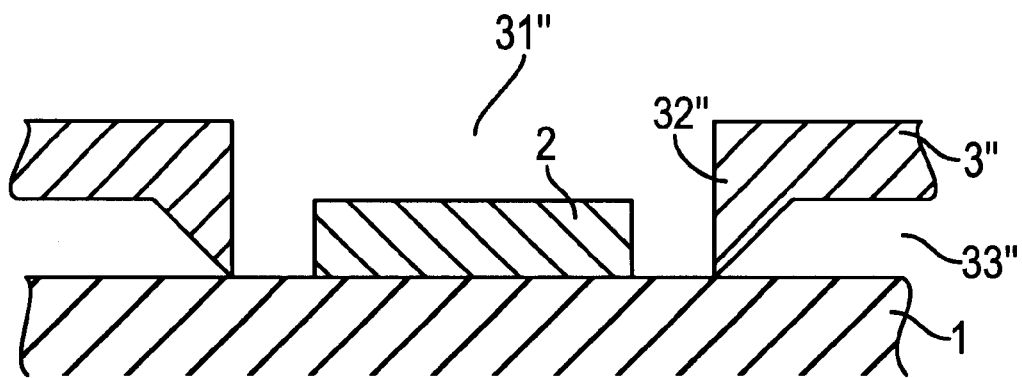
FIG. 13 is a partial side sectional view of another conventional mask.
Figure 14:
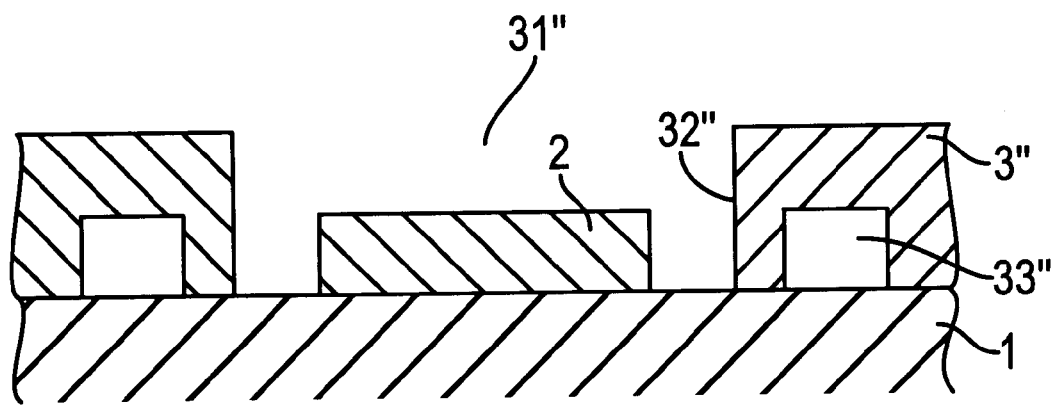
FIG. 14 is a partial side sectional view of still another conventional mask.
Figure 15A:
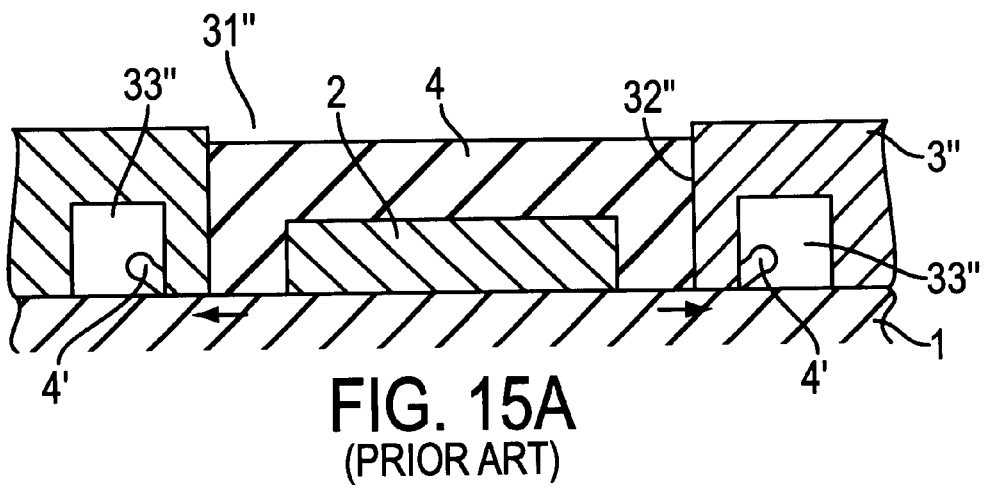
FIG. 15($a$) is a partial side sectional view showing the problem points posed when the mask of FIG. 14 is used under reduced pressure.
Figure 15B:
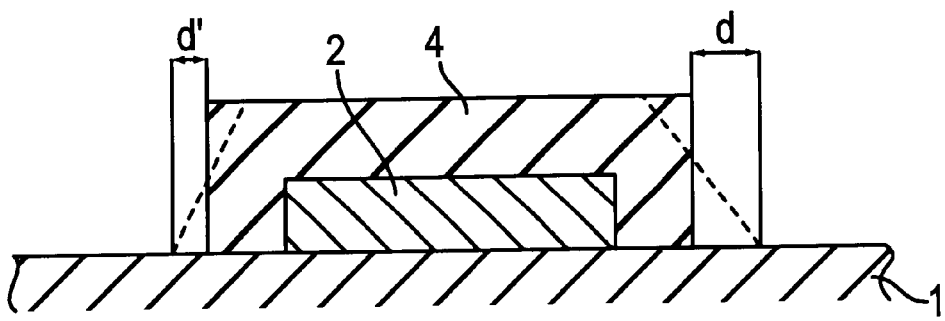
Figure 16A:
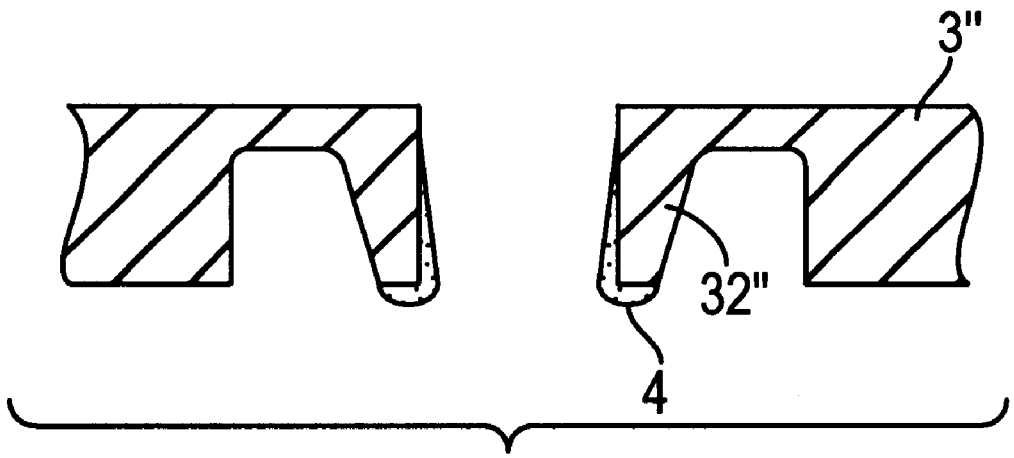
FIG. 16($a$) is a partial side sectional view for explaining the problem points of still another conventional mask.
Figure 16B:
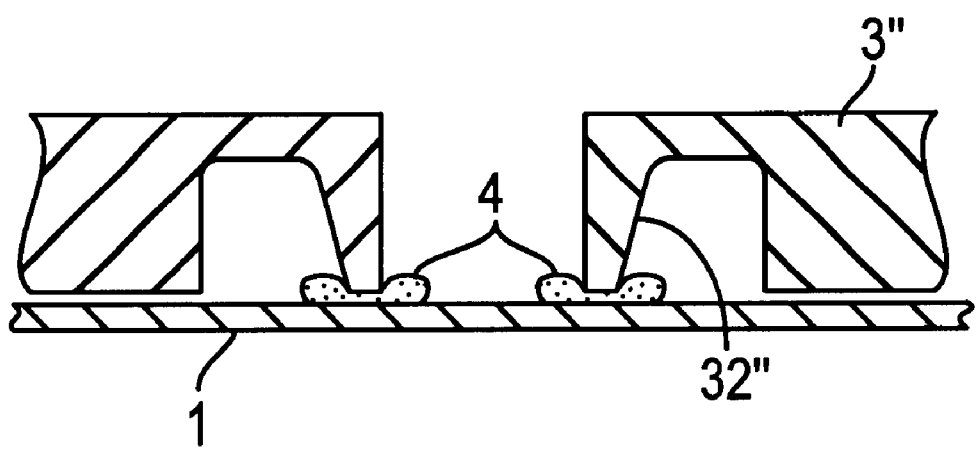

This applicant has considered ways of solving the problems of FIG. 14 using a method of coating a sealing material by squeegee under a reduced pressure. In the case where the sealing material is coated under the atmospheric pressure, air is contained in the sealing material, often generating voids (pores) in the sealing layer. In order to prevent this, the coating is conducted in an ambience of a reduced pressure. Subsequently, however, it has been found that this reduced pressure method has a problem, in that when the ambience is returned to the atmospheric pressure after coating, the ambience outside of the mask 3" returns to the atmospheric pressure, whereas the interior of the space portion 33" remains under a reduced pressure for some time. This pressure difference causes a part 4' of sealing material 4 in the opening 31" to be pulled into space portion 33" as shown in FIG. 15(a). The sealing material 4 expanded this way is shown by d, d' of FIG. 15(b). The amount of expansion of sealing material 4 due to the pressure difference is varied depending on the density of the wiring pattern and the surface material (resist or a wiring pattern) (d>d'). Thus, the foot of sealing material 4 assumes an irregular form, leading to the situation in which the sealed area is not accommodated in the design range. A similar problem is also posed for the mask shown in FIG. 13. In this way, the coating under a reduced pressure has been found to develop a coating failure.

Figure 1:
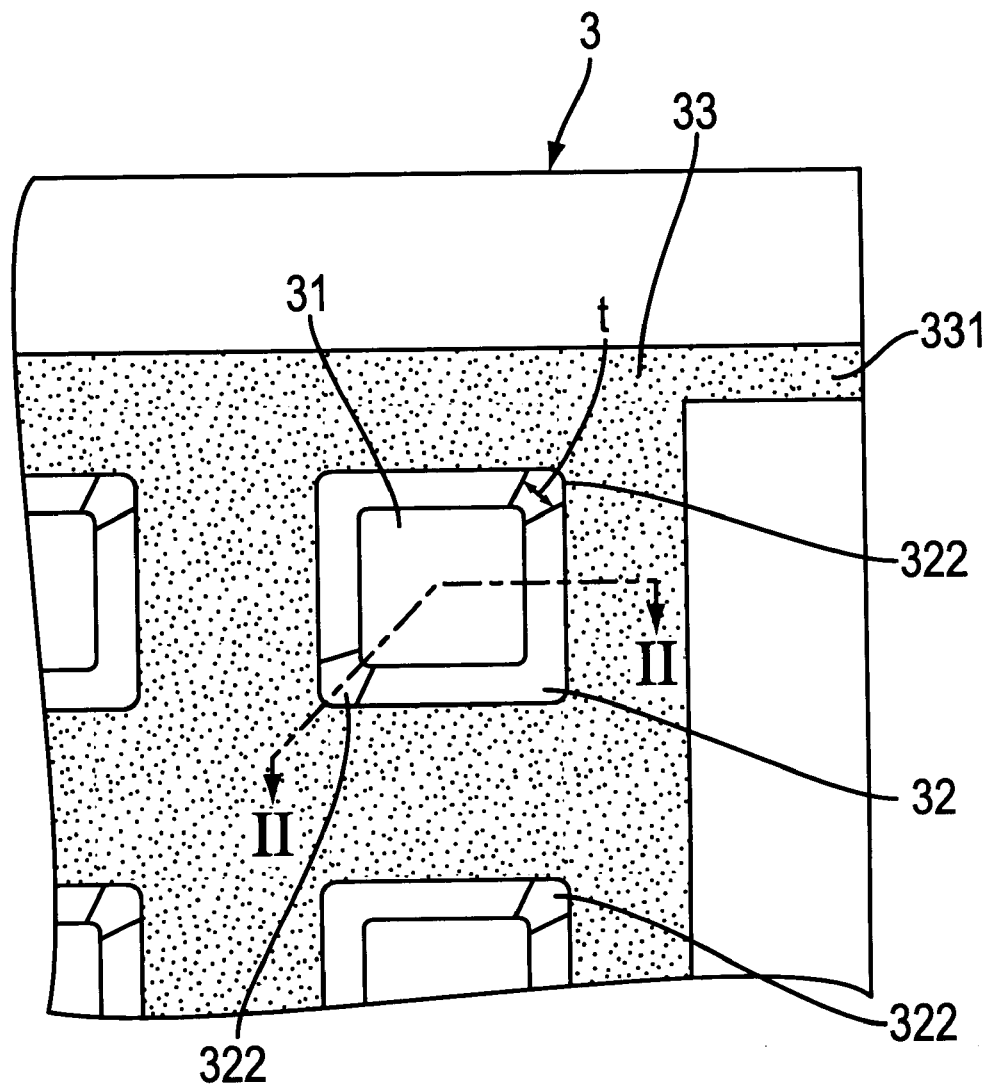
FIG. 1 is a partial back view showing an embodiment of a mask according to the invention.
Figure 2A:
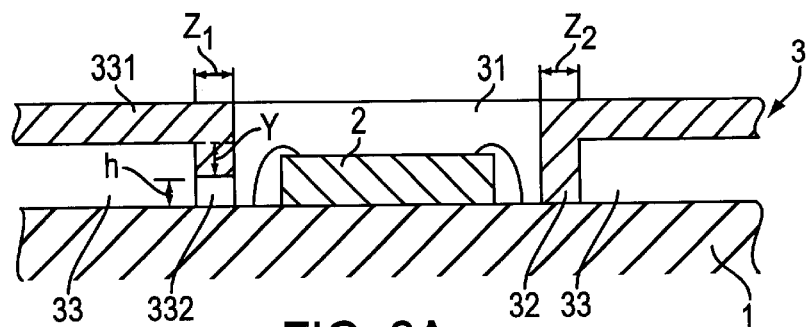
FIG. 2($a$) is a sectional view taken along the line II—II showing the manner in which the mask of FIG. 1 is used.

FIG. 1 shows a semiconductor element seal coating mask according to the present invention. The openings 31 each have an annular protrusion 32 on the back side thereof in conformance with the corresponding opening 31. As shown, the annular protrusion 32 is in the form of a rectangular frame. FIG. 2(a) is a sectional view taken from line II—II in FIG. 1, and shows the outside portion of the annular protrusion 32 on the back side is thinner than the whole thickness of the mask 3 and forms a gap with the surface of the wiring board 1 thereby to form a space portion 33.

Each annular protrusion 32 has clearances 322 at the opposed corners thereof. With mask 3 overlaid on wiring board 1, the opening 31 inside of the annular protrusion 32 and space portion 33 are connected to each other through clearances 322. The height h of each clearance 322 is approximately 0.01 to 0.5 mm, or preferably, in the range of 0.05 to 0.3 mm. The height (length) y of the portions of the annular protrusion above this clearance 322 is about 0.1 to 0.5 mm.

As shown in FIG. 1, according to this embodiment, the width t of the clearance 322 progressively increases outward. Alternatively, the clearance width may be constant. The width t is about 0.1 to 2.0 mm in this embodiment.

At this clearance 322, the width (thickness) $z_1$ of the lower end surface of annular protrusion 32 may be increased to about 2 mm. Preferably, however, it is not more than about 0.5 mm, and moot preferably, 0 mm. The width (thickness) $z_2$ of the lower end surface portion of the annular protrusion 32 in contact with the surface of the wiring board is preferably not less than about 0.6 mm so that the coated wire may not be cut with a sharp edge, and the durability of the mask may be increased by making the annular protrusion difficult to chip off. In other words, the width $z_2$ is preferably in the range of about 0.6 to 2 mm. With this width, the lower end surface of the annular protrusion 32 comes into surface contact with the surface of the wiring board 1.

Figure 2B:
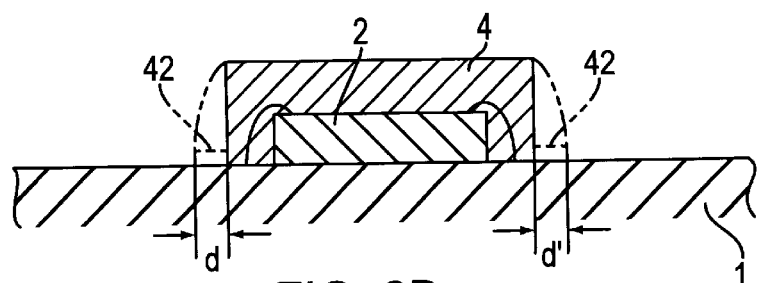
Figure 2C:
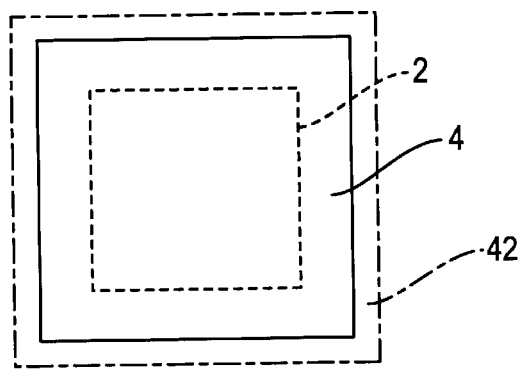

As shown in FIGS. 2(b) and 2(c), therefore, sealing material 4 curled in from the inner peripheral surface of opening 31 attaches in the form of a thick frame 42 with a substantially predetermined width on the surface of wiring board 1. As a result, even in the case where the peripheral side surfaces of the ridge (sealing portion) of sealing material 4 flow and form a slope as shown by two-dot line in FIG. 2(b), the spread of the edge of the foot around the whole periphery of the ridge is held within the width of the frame 42 as shown by the one-dot line in FIG. 2(c). Specifically, the spread amount is substantially the same (d, d') for the whole peripheral portion, so that the foot is accurately accommodated within the design range. When the width (thickness) of the lower end surface of the annular protrusion 32 exceeds 2 mm, however, the leakage of sealing material 4 is likely to spread irregularly.

Figure 3:
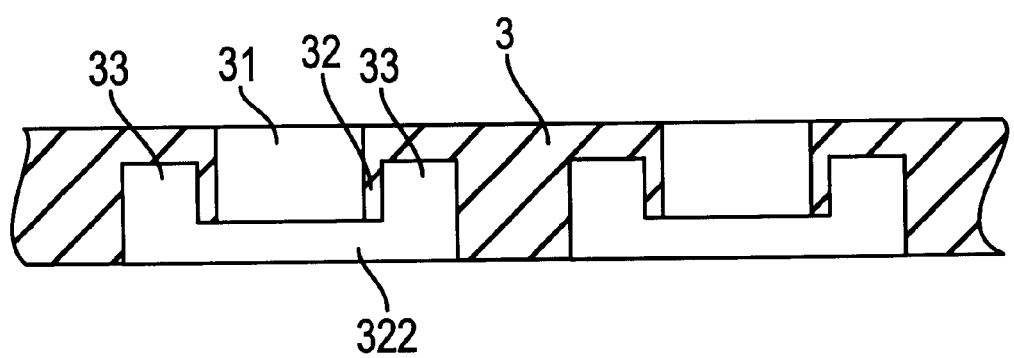
FIG. 3 is a partial side sectional view showing another embodiment of a mask according to the invention.

FIG. 3 shows the clearances 322 of height h in the range of 0.01 to 0.5 mm may be formed in parts of the annular protrusion 32 of mask 3. However, as seen from FIG. 3, clearance 322 is preferably formed over the entire periphery of annular protrusion 32. When clearance 322 is formed over the entire periphery of annular protrusion 32, the durability of mask 3 is so high that the circuits and the surface of the wiring board are not easily damaged. Also, the root of sealing material 4 is readily accommodated accurately over the entire periphery thereof within the design range.

According to the present invention, when the mask is set on the wiring board, it is adapted to form clearances of 0.0 to 0.5 mm with the wiring board. Even in the case where the drips of the sealing material attach to the forward end of the annular protrusion, therefore, no force is exerted to push out the drips or such a force, if exerted, is decreased. As a result, the spread of the root of the sealing layer is reduced, and the irregularity of the spread is substantially eliminated. In the process of forced coating under normal pressure, clearances of 0.05 to 0.5 mm are desirable. Under normal pressure or under a reduced pressure, when the clearances increase beyond 0.5 mm, the amount of the sealing material leaking out of the clearances increases to such an extent that the spread of the root cannot be easily suppressed.

According to the present invention, the mask may be fabricated in the same manner as a metal screen by etching to leave the annular protrusion.

For generating a clearance between the forward end of the annular protrusion and the wiring board, the height of the protrusion is of course required to be smaller than the whole thickness of the mask. Fabrication methods conceived to meet these requirements include: (1) a method in which the mask potion involved is cut in to form an annular protrusion, and (2) a method in which a plate material having an eaves-shaped annular protrusion is overlaid on another plate material having a simple opening so that the annular protrusion of the former may intrude into the opening space of the latter. Method (2) is the better method because the accuracy of the thickness of the annular protrusion and the clearance is improved.

Figure 4A:
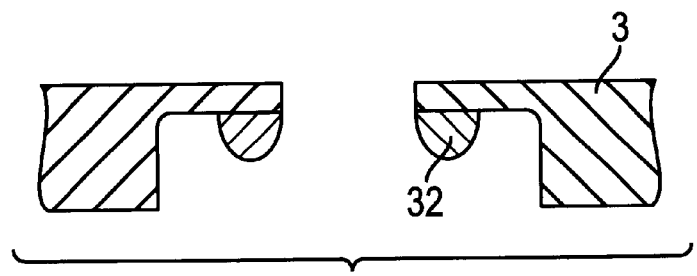
FIG. 4($a$) is a side sectional view showing an example configuration of the annular protrusion of the mask where the annular protrusion is formed of a material different from that of the body of the mask.
Figure 4B:
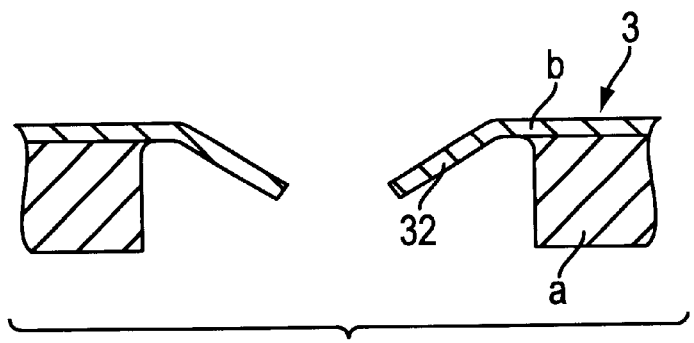
Figure 4C:
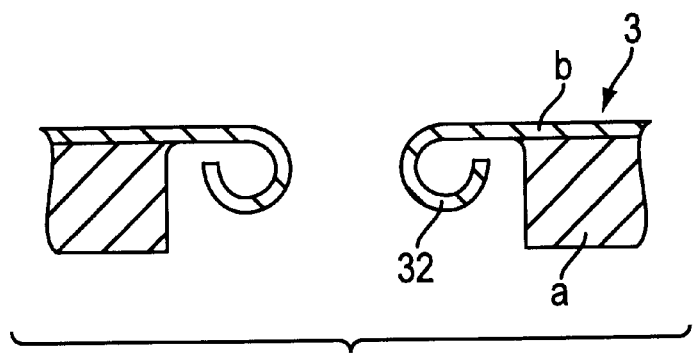

Examples of configurations of the annular protrusion of the mask according to the present invention, in addition to the integrated one shown in FIG. 3. include; a configuration in which, as shown in FIG. 4(a), the annular protrusion 32 is formed of a resin material or the like material different from that of the body of the mask 3; a configuration in which, as shown in FIG. 4(b), the mask 3 is constituted of two materials, a plate material 'a' having a large opening and a thin plate material 'b' overlaid thereon, with the thin plate material 'b' projected like eaves in the opening of the plate material 'a' thereby to form the annular protrusion 32; and a configuration in which as shown in FIG. 4(c), the forward end of the eaves is curled in. In the case where a mask thickness as small as not more than 0.5 mm is required, for example, the etching is difficult. According to the examples of FIGS. 4(b) and 4(c), however, this difficulty is tactfully overcome. The structure of FIG. 4(c) suitably applies to the case in which the structure of FIG. 4(b) is short of strength.

Figure 5A:
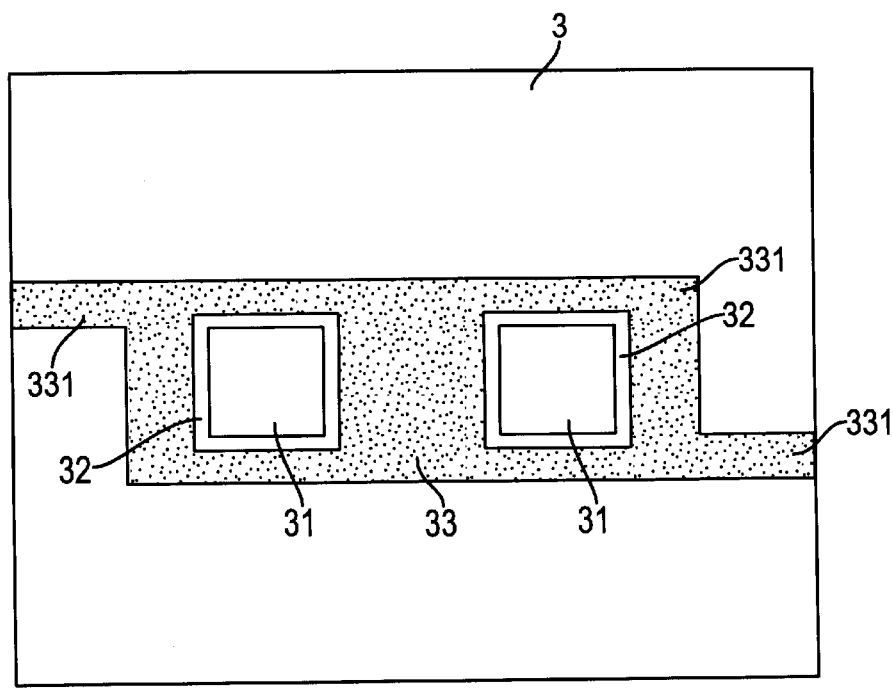
FIGS. 5($a$) and 5($b$) are back views showing two examples of a part of the mask of FIG. 3.
Figure 5B:
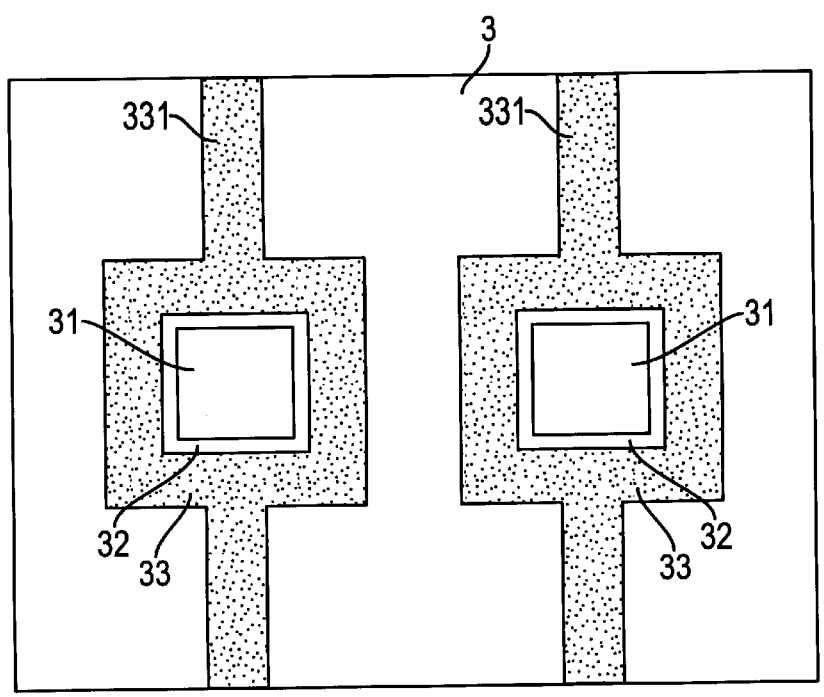
Figure 6A:
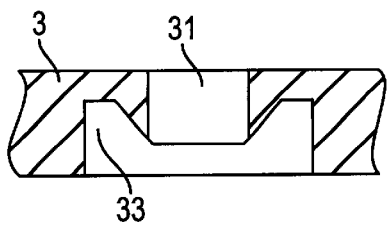
FIGS. 6($a$)–6($e$) are partial side sectional views showing five forms of the space portion of the mask.
Figure 6B:
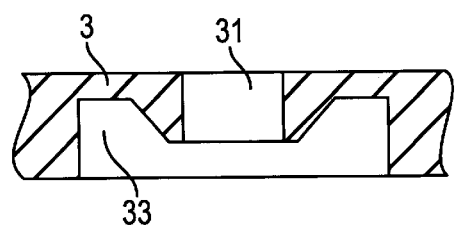
Figure 6C:
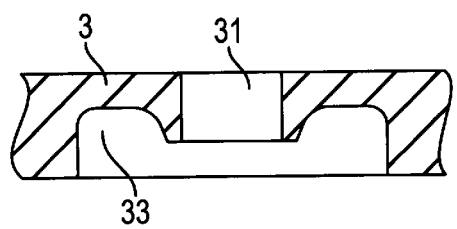
Figure 6D:
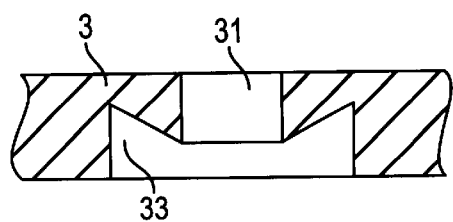
Figure 6E:
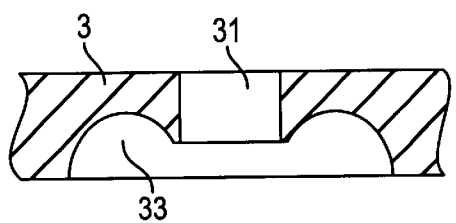

In the mask 3, the opening 31 is either single or plural. FIG. 5(a) shows where a plurality of openings 31 are formed in which the space portions 33 outside of the openings 31 communicate with each other. In the case shown in FIG. 5(b), the space portions 33 outside of the openings 31 are independent of each other. In FIGS. 5(a) and 5(b), numeral 331 designates a leak passage for the space portion 33 to communicate with the outside of the mask 3.

In the embodiment shown in FIG. 1, space portions 33 are connected with each other in the back of mask 3, and communicate with the exterior at the end of mask 3. For this purpose, the end of mask 3 is formed with a leak passage 331 for leading space portions 33 to the exterior. The leak passage 331 is open to the exterior of the mask at a portion thereof such as at an end of the mask where the sealing material is not coated. In the presence of leak passage 331, the interior of space portion 33 is always maintained at the same pressure as the exterior of mask 3. Depending on the embodiments, however, leak passage 331 is not necessarily required.

Figure 7A:
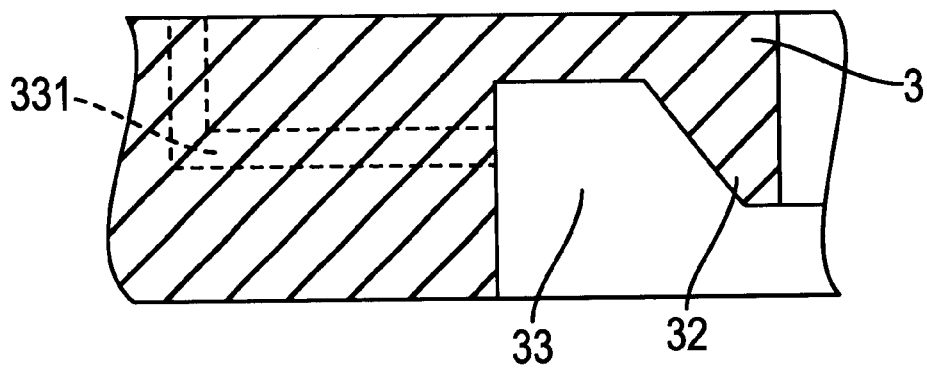
FIGS. 7($a$) and 7($b$) are partial side sectional views showing two forms of the leak passage of the mask.
Figure 7B:
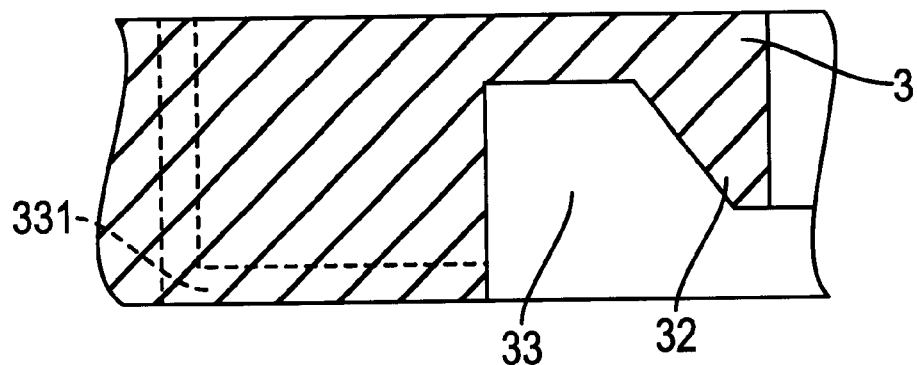

FIGS. 6(a) to 6(e) show that space portion 33 of mask 3 may take various forms. The leak passage 331 for connecting clearance 322 to the exterior of mask 3 may also either lead through the middle of mask 3 as shown in FIG. 7(a), or along the bottom of mask 3 as shown in FIG. 7(b). In any case, however, the open end of the leakage passage 331 is required to be located at a portion of mask 3 where the sealing material is not coated. Also, as shown in FIGS. 1, 5(a) and 5(b), the open end of the leakage passage 331 may be located at an end of mask 3.

According to the present invention, space portion 33 may be connected to the exterior through leak passage 331 (FIGS. 1, 5(a), 5(b), 7(a) and 7(b)). Therefore, no pressure difference develops between the interior and the exterior of annular protrusion 32. This is effective especially in the case where the coating is conducted under a reduced pressure.

In addition, at least part of the whole periphery of annular protrusion 32 may be formed with a clearance 322 of about 0.01 to 0.5 mm between it and the front surface of the wiring board. This clearance 322 may perform two functions. First, even under a reduced pressure where a slight amount of air remains and sealing material 4 is filled in opening 31, the air remaining in opening 31 would be mixed with sealing material 4 and cause a void. According to the present invention, however, the air remaining in opening 31 is pushed out into space portion 33 due to the function of sealing material 4, and therefore, the air is prevented from mixing with sealing material 4. Secondly, when the ambience is returned to the atmospheric pressure after coating, the air flows into space portion 33 through leak passage 331. The sealing material, which has leaked out into space portion 33 when the sealing material is coated, is pushed back into opening 31 through clearance 322 by the force of the air flow. The force is generated by the air pressure going back to atmospheric one. In the case where clearance 322 is formed along the whole periphery of annular protrusion 32, sealing material 4 is pushed back uniformly over the whole periphery. Therefore, the shape of the root of sealing material 4 may be easily accommodated within the design range over the whole periphery. In the case where the height of clearance 322 is smaller than about 0.01 mm, the sealing material (resin) is not easily restored. In the case where the height h of clearance 322 is larger than about 0.5 mm, on the other hand, more sealing material leaks out at the time of coating the sealing material.

The contamination of the front surface of the wiring board by the leakage of the sealing material increases with the number of coating sessions. Therefore, the effect of leakage prevention may be determined by the number of coating sessions. In the case of the mask not formed with annular protrusion 32, the front surface of the wiring board is contaminated only after two coating sessions under a reduced pressure. Even with the mask having a sharp lower end of the annular protrusion in surface contact with the front surface of the wiring board, contamination may occur after about ten coating sessions under a reduced pressure. Incidentally, the mask may be used for as many as 50 coating sessions under atmospheric pressure. The mask according to the present invention shown in FIG. 1, on the other hand, may be used for 50 coating sessions even under a reduced pressure. Especially, the mask according to the present invention shown in FIG. 3 may be used for 100 coating sessions.

Figure 11A:
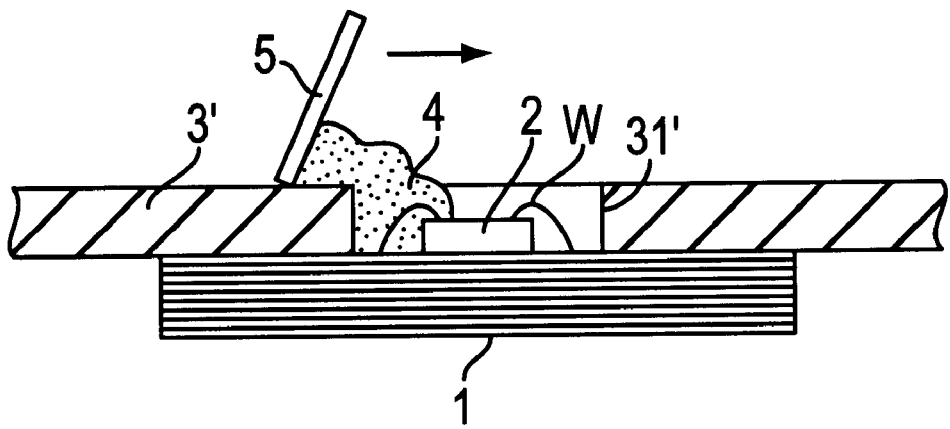
FIG. 11($a$) is a partial side sectional view showing the manner in which the conventional mask is used.
Figure 11B:
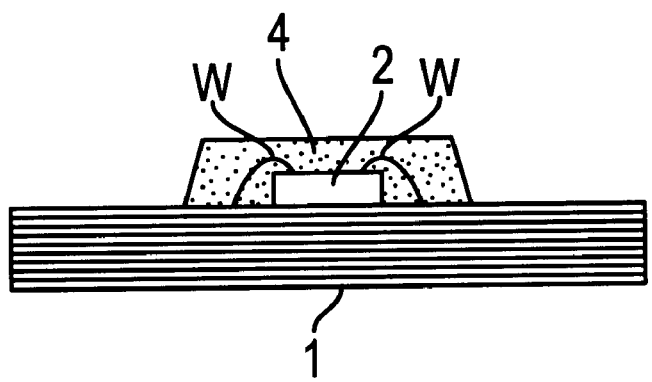
Figure 12A:
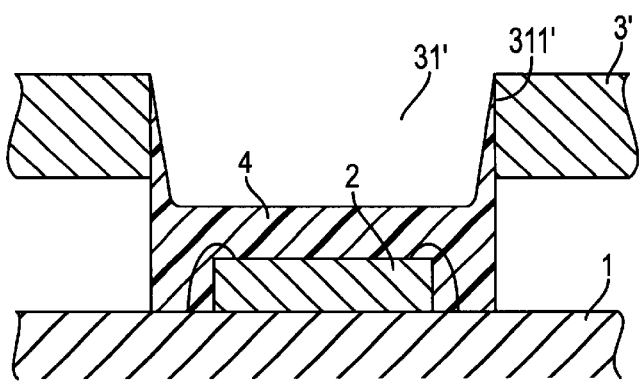
FIG. 12($a$)–12($c$) are partial side sectional views showing the problem points posed when the conventional mask is used.
Figure 12B:
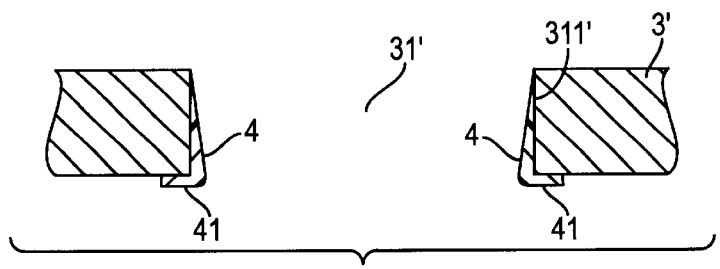
Figure 12C:
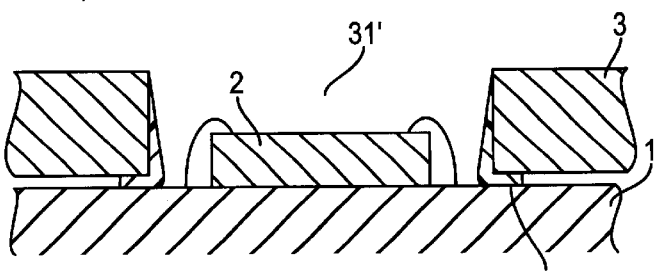
Figure 12D:
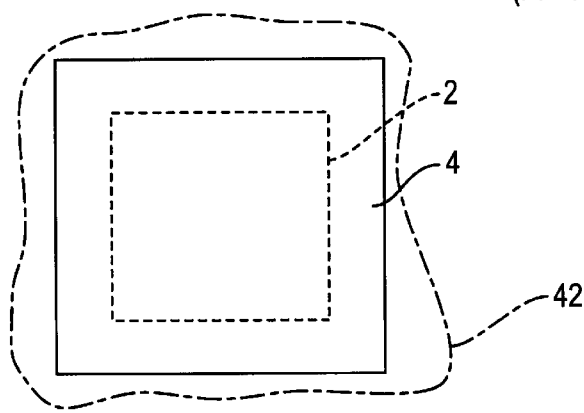

The process of sealing a semiconductor element in a method of fabricating a semiconductor device according to the present invention is basically not different from the process of the conventional method shown in FIGS. 11(a) and 11(b) except that the mask according to the present invention described above may be used for coating and sealing a semiconductor element. Specifically, as shown in FIG. 2(a), a plurality of semiconductor elements 2 are mounted on a wiring board 1, while a coating mask 3, having a plurality of openings 31 at the mounting positions of the plurality of semiconductor elements 2, is overlaid on wiring board 1 in such a position that the plurality of semiconductor elements 2 are located within the plurality of openings 31 respectively. Then, a sealing material (not shown) supplied on mask 3 is forced in by a squeegee (not shown) and thus coated on the front surface of wiring board 1 through the openings 31 of mask 3 thereby to seal the semiconductor elements 2.

Figure 8:
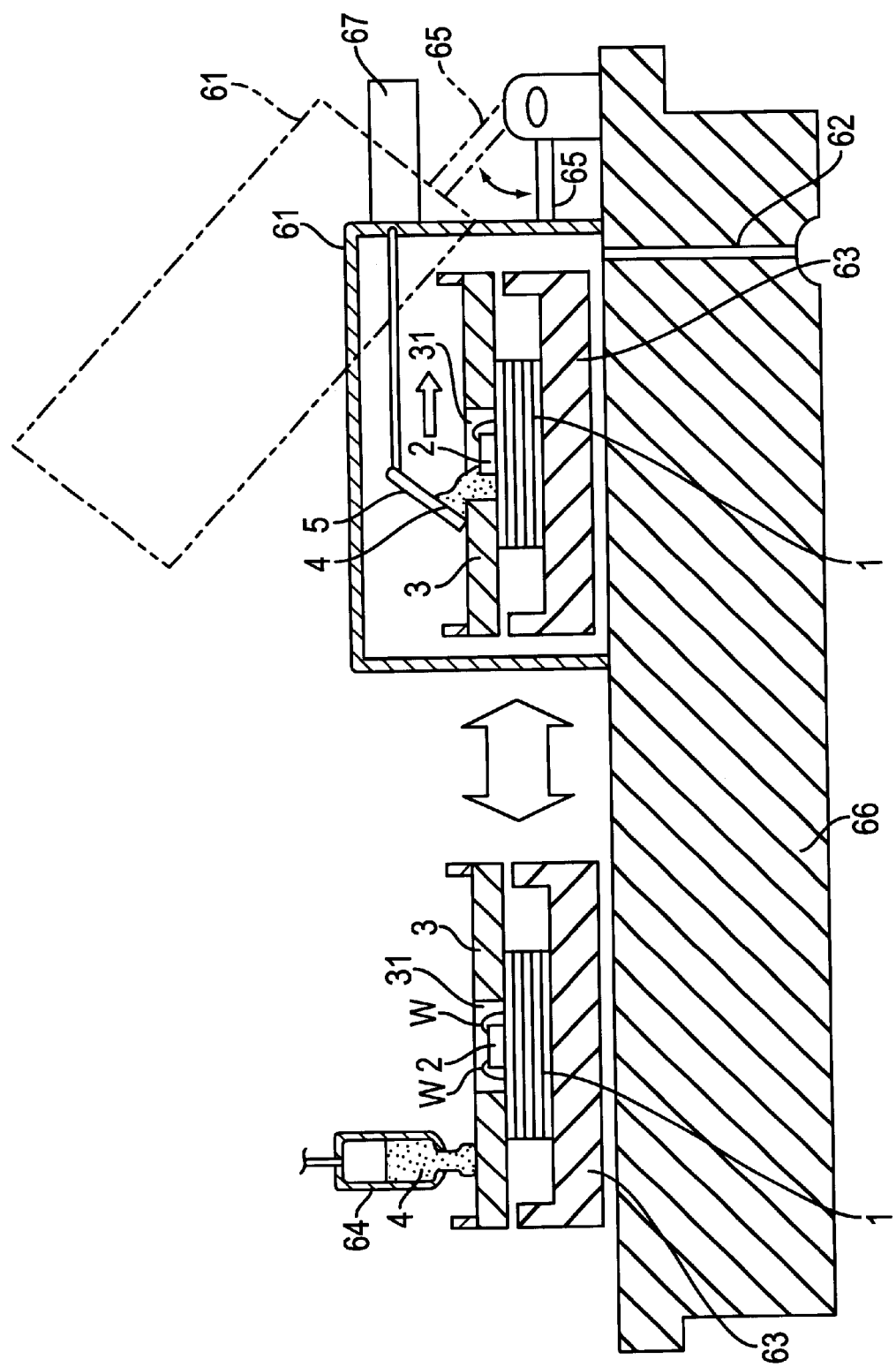
FIG. 8 is a side view showing an embodiment of a method for fabricating a semiconductor device according to the invention.

FIG. 8 shows that in this case, after mounting the semiconductor element 2, setting the mask 3, and supplying the sealing material, sealing material 4 is forced in by squeegee 5 under a reduced pressure in a vacuum chamber 61 for each wiring board 1. When the sealing material is forced in for coating, the air is present in the sealing material, and bubbles (voids) may remain in the sealed portion. In the case where the forced coating is conducted under a reduced pressure as described above, however, the air is not easily present in the sealing material. The degree of pressure reduction in vacuum chamber 61, though not specifically limited, is set to not more than 30 kPa, for example, or preferably to not more than 3.3 kPa. After the coat sealing, the ambience is restored to atmospheric pressure and the air is introduced from the end of mask 3 through space portion 33 to clearance 322 thereby to separate the mask 3 from the wiring board 1.

In FIG. 8, a path 62 opened into a vacuum chamber 61 is connected to a vacuum pump (not shown) for reducing the pressure in chamber 61. The wiring board 1 is mounted on a receiving tray 63 before entering vacuum chamber 61, and mask 3 is overlaid on it. The mask 3 is supplied with sealing material 4 from a syringe 64. The sealing material 4 preferably contains an inorganic filler of about 40 to 90 weight %, has a viscosity of about 100 to 500 ps (25° C.) and has a thixotropy index of about 1.0 to 4.5 (25° C.).

Receiving tray 63 enters vacuum chamber 61 and the sealing work described above is started. The chamber 61 swings vertically by the function of a rotary lever 65. The chamber 61 moves up when the receiving tray 63 enters, and moves down to cover receiving tray 63 when the receiving tray 63 reaches the sealing position on work bench 66. A squeegee 5 conducts the forced coating work with the cooperation of an air cylinder 67. In the case where the sealing work is conducted in a heated environment of about 25 to 40° C., for example, the viscosity of sealing material 4 is reduced and, therefore, bubbles are removed easier. Also, it is hard for the stringiness to occur when mask 3 is released from wiring board 1. When the heated environment reaches syringe 64, the storage life of sealing material 4 shortens. For this reason, an electric heater (not shown) is provided on the semiconductor mounting position of receiving tray 63, or alternatively, only the required portions are preferably heated, for example, at about 40 to 100° C.

When the interior of vacuum chamber 61 is restored to the atmospheric pressure after seal coating under a reduced pressure, the front surface of the sealing layer may roughen. Therefore, after conducting the seal coating as described above at not higher than about 0.7 kPa, the pressure is alleviated so that the interior of chamber 61 is regulated to not lower than about 0.7 kPa, and not higher than the atmospheric pressure. Then, squeegee 5 is reactivated to conduct the finish coating of sealing material 4.

Figure 9:
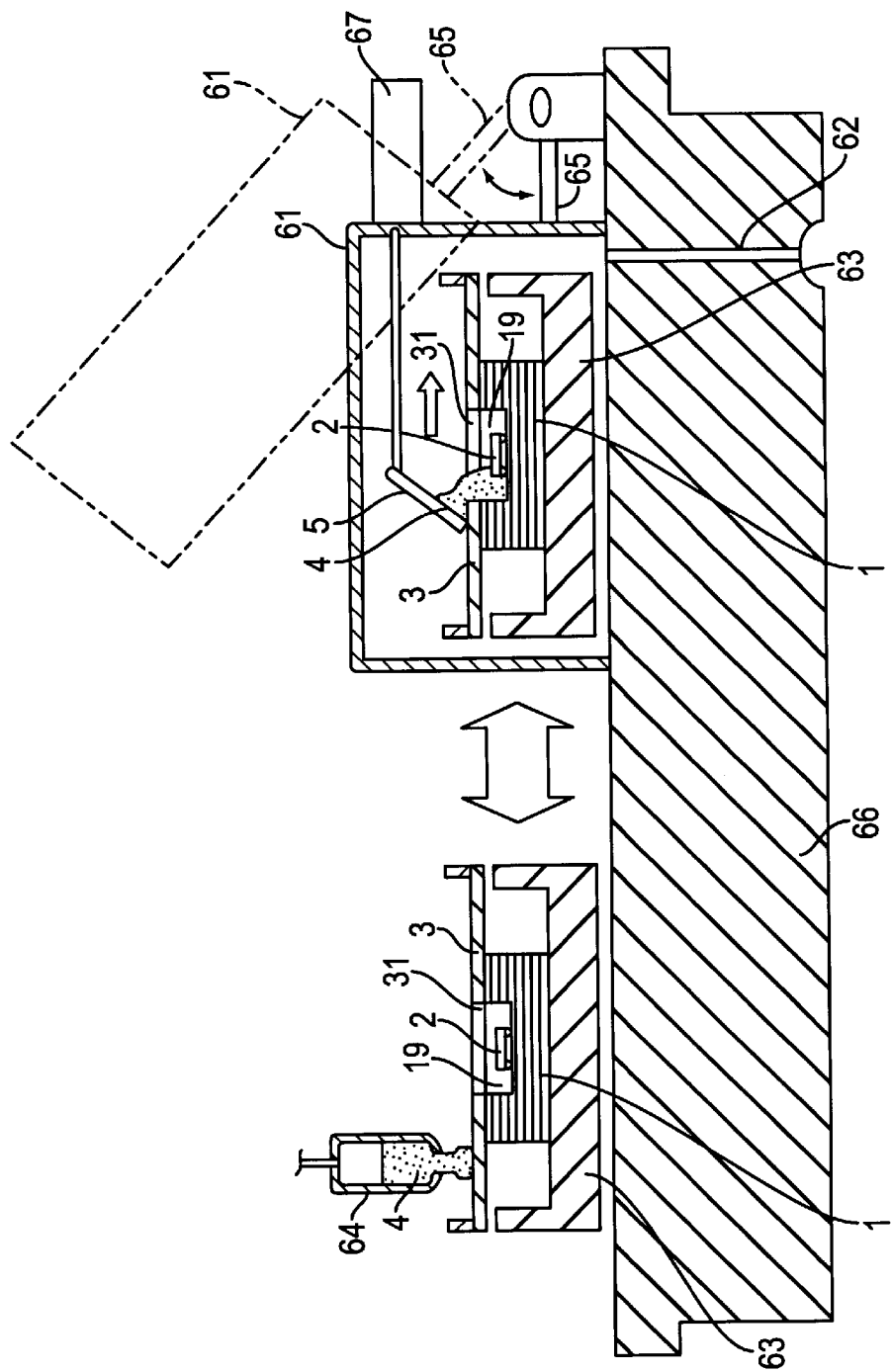
FIG. 9 is a side view showing another embodiment of a method for fabricating a semiconductor device according to the invention.
Figure 10:
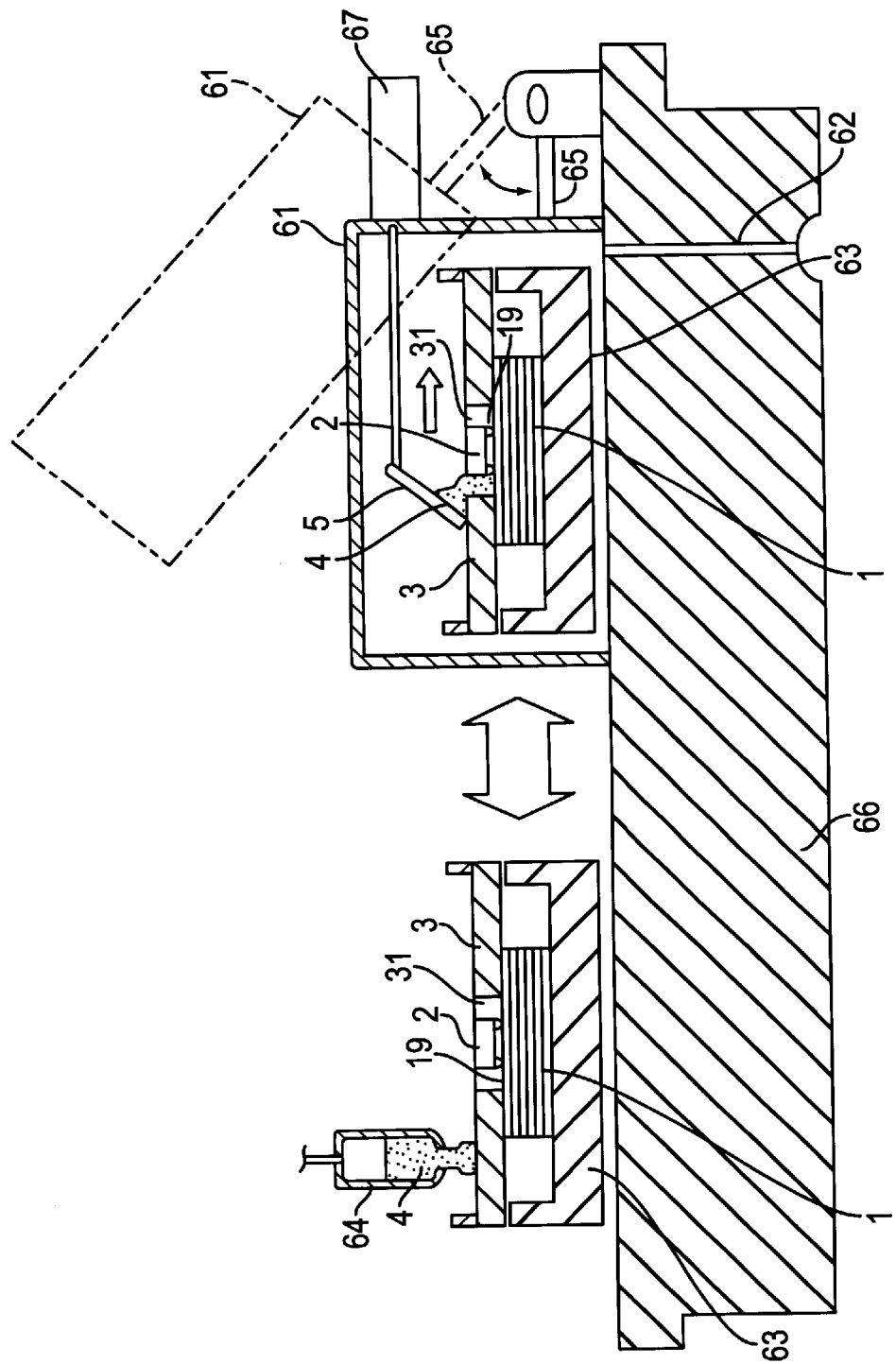
FIG. 10 is a side view showing still another embodiment of a method for fabricating a semiconductor device according to the invention.

FIG. 9 shows an example of the work conducted in the case where semiconductor element 2 is placed in a recess 19 in the surface of wiring board 1. FIG. 10 shows an example of the work conducted in the case where the surface of semiconductor element 2 is flush with the surface of mask 3. In FIGS. 9 and 10, the same reference numerals as those in FIG. 8 designate the same component parts, respectively.

A description is given below of an embodiment in which the forced coating is conducted under the normal pressure using the above-mentioned mask according to the present invention.

A mask having a thickness of about 1.0 mm according to industry standard SUS304 (a kind of American Iron and Steel Institute (AISI) stainless steel) may be used. Panasealer CV5420A (made by Matsushita Electric Works Ltd.) may be used as a sealing material. Preferably, a liquid sealing material can be used. The viscosity of this sealing material is about 700 poise (as measured by the B-type viscometer at 25° C.) and the thixotropy index thereof is about 1.2 (measured by the B-type viscometer at 25° C.).

A glass-epoxy board (no wiring and no elements) may be used as the board. The temperature of the board and the resin is maintained at approximately 30±0.5° C. at the time of coating. Also, the sealing material is coated under the atmospheric pressure by one reciprocation of the hard squeegee of industry standard SUS304.

After the mask is removed, the resin is cured at about 100° C. for one hour, and further at 150° C. for three hours. The spread width of the resin may be measured along the planar direction, which may not be horizontal. When the seal coating is conducted using a mask having an opening size of about 20.0×20.0 mm, the spread diameter of the hardened resin on the board may be compared with the size of the opening. The rate of spread increase may be calculated from the following equation (1). Also, the rate of spread increase for the first coating session as compared with the 50th coating session may be calculated from the equation (2) below. The result of these embodiments and comparative examples are shown in Table 1.

TABLE 1

$$\{(\text{Spread diameter of cured resin for each session}-20.0)/20.0\} \times 100 \quad (1)$$

$$\frac{[\{(\text{Spread diameter of cured resin for 50th coating session}) - (\text{Spread diameter of cured resin for 1st coating session})\}}{\text{Spread diameter of cured resin for 1st coating session}]} \times 100 \quad (2)$$

| Protruded structure | Embodiment Protruded | | | | Comparative Example Protruded | | Not protruded |
|---|---|---|---|---|---|---|---|
| Clearance size (mm) | 0.05 | 0.1 | 0.3 | 0.5 | 0.8 | 0 | — |
| Protrusion size (mm) | 0.75 | 0.7 | 0.5 | 0.3 | 0.1 | 0.8 | — |
| 1st session | 21.7 | 21.8 | 21.9 | 22.1 | 23.1 | 21.6 | 21.6 |
| 2nd session | 21.5 | 21.7 | 21.8 | 22.0 | 22.9 | 21.8 | 22.5 |
| 3rd session | 21.6 | 21.8 | 21.9 | 22.1 | 22.8 | 21.9 | 23.6 |
| 5th session | 21.6 | 21.8 | 22.0 | 22.1 | 22.9 | 22.3 | 24.1 |
| 10th session | 21.5 | 21.7 | 22.1 | 22.2 | 23.1 | 22.5 | 26.5 |
| 15th session | 21.8 | 21.8 | 22.0 | 22.2 | 23.4 | 22.5 | 26.7 |
| 20th session | 22.0 | 21.8 | 22.0 | 22.3 | 22.3 | 22.7 | 27.3 |
| 30th session | 22.0 | 21.9 | 22.0 | 22.4 | 23.9 | 22.9 | 29.2 |
| 40th session | 22.1 | 22.0 | 22.0 | 22.5 | 24.2 | 23.0 | 31.5 |
| 50th session | 22.3 | 22.1 | 22.0 | 22.5 | 24.5 | 23.1 | 33.5 |
| Average | 21.8 | 21.8 | 22.0 | 22.2 | 23.5 | 22.4 | 26.6 |

TABLE 1-continued $$\{(\text{Spread diameter of cured resin for each session} - 20.0)/20.0\} \times 100 \quad (1)$$

$$\left[\frac{\{(\text{Spread diameter of cured resin for 50th coating session}) - (\text{Spread diameter of cured resin for 1st coating session})\}}{\text{Spread diameter of cured resin for 1st coating session}}\right] \times 100 \quad (2)$$

| Protruded structure | | Embodiment Protruded | | | | Comparative Example Protruded | | Not protruded |
|---|---|---|---|---|---|---|---|---|
| Spread increase rate against mask opening diameter | 1st session (%) | 8.5 | 9.0 | 9.5 | 10.5 | 15.5 | 8.0 | 8.0 |
| | 50th session (%) | 11.5 | 10.5 | 10.0 | 12.5 | 22.5 | 15.5 | 67.5 |
| | Average | 9.1 | 9.0 | 10.0 | 11.0 | 17.5 | 12.0 | 32.5 |
| Spread diameter increase rate for 50th from 1st coating session is determined as x (%)* | | 2.8 | 1.3 | 0.5 | 1.8 | 6.1 | 6.9 | 55.1 |
| | | a | b | b | b | c | c | d |

*The symbols "a", "b", ",c", "d" denotes the range of values for x whereby:
b: 2% > x very good;
a: 2% ≦ x < 5% good;
c: 5% ≦ x < 10% mediocre; and
d: 10% ≦ x bad With the mask and the method of use thereof according to the present invention, the space portion formed outside of the annular protrusion is opened to the mask exterior, and therefore, no pressure difference occurs between the interior and exterior of the annular protrusion. Also, the sealing material that has leaked out into the space portion is returned into the mask opening by way of the clearance formed in the annular protrusion. As a result, according to the present invention, the seal coating may be carried out beautifully. Further, the clearance formed in the annular protrusion may prevent the air from mixing with the sealing material layer, and therefore, voids are not easily formed in the sealing resin layer.

The sealing material may be returned comparatively uniformly over the whole periphery of the annular protrusion by forming the clearances at the opposed corners, or along the whole periphery of the annular protrusion.

After complete seal coating work, the finish coating is conducted. The sealing resin layer may thus be finished in an attractive fashion.

It is noted that the foregoing examples have been provided merely for the purpose of explanation and are in no way to be construed as limiting of the present invention. While the present invention has been described with reference to a preferred embodiment, it is understood that the words which have been used herein are words of description and illustration, rather than words of limitation. Changes may be made within the purview of the appended claims, as presently stated and as amended, without departing from the scope and spirit of the present invention in its aspects. Although the present invention has been described herein with reference to particular means, materials, and embodiments, the present invention is not intended to be limited to the particulars disclosed herein, rather, the present invention extends to all functionally equivalent structures, methods and uses, such as arc within the scope of the appended claims.

What is claimed is:

1. A seal coating mask for a semiconductor element comprising:

a seal coating mask having a front and a back, and comprising at least one opening, said at least one opening being positioned on said seal coating mask so as to correspond with at least one semiconductor element mounted on a wiring board;

an annular protrusion along an entire periphery of said at least one opening, said annular protrusion being structured and arranged to form a clearance of about 0.01 to 0.5 mm between at least a part of an entire periphery of the annular protrusion and a front surface of the wiring board when said back of said seal coating mask is positioned on the wiring board; and a space portion on the back of the seal coating mask for cutting off sealing material outside of the annular protrusion, the coating mask being used to forcibly coat a material for sealing the at least one semiconductor element in the front surface of the wiring board.

2. The seal coating mask according to claim 1, the space portion communicating with an exterior of the seal coating mask, the space portion not coated with the sealing material.

3. The seal coating mask according to claim 1, the annular protrusion comprising a protruded rectangular frame having the clearance at opposed corners of said protruded rectangular frame.

4. The seal coating mask according to claim 2, the annular protrusion comprising a protruded rectangular frame having the clearance at opposed corners of said protruded rectangular frame.

5. The seal coating mask according to claim 1, the annular protrusion being formed with the clearance along the entire periphery of the annular protrusion.

6. The seal coating mask according to claim 2, the annular protrusion being formed with the clearance along the entire periphery of the annular protrusion.

7. The seal coating mask according to claim 1, the annular protrusion being formed of resin.

8. The seal coating mask according to claim 1, further comprising a leak passage extending from the space portion to an exterior of the seal coating mask.

9. The seal coating mask according to claim 8, the leak passage extending from a central portion of the space portion.

10. The seal coating mask according to claim 8, the leak passage extending from an edge of the space portion.

11. The seal coating mask according to claim 1, the annular protrusion being formed of a thin eaves-shaped plate about 0.05 to 0.5 mm thick.

12. The seal coating mask according to claim 11, wherein said eaves-shaped plate comprises curled in forward ends.

13. A method of fabricating a semiconductor device using the seal coating mask of claim 1 comprising:

mounting the semiconductor element on the wiring board;

overlaying the seal coating mask on the wiring board, the seal coating mask being overlaid such that the semiconductor element is located inside the at least one opening;

using a squeegee to forcibly coat sealing material onto the front surface of the wiring board through the at least one opening of the seal coating mask in order to seal the semiconductor element onto the wiring board; and releasing the mask from the wiring board.

14. The method of fabricating according to claim 13, comprising:

reducing an ambience pressure after the overlaying; and restoring the ambience pressure to atmospheric pressure after the coating.

15. The method of fabricating according to claim 14, the reduced ambience pressure being not higher than 0.7 kPa during the coating, the coating then being repeated under a reduced pressure of not lower than 0.7 kPa to finish coating the sealing material.

16. The method of fabricating according to claim 14, the reduced ambience pressure being not higher than 0.7 kPa during the coating, the coating then being repeated under the atmospheric pressure to finish coating the sealing material.

17. The method of fabricating according to claim 13, the overlaying, supplying, and coating occurring in a vacuum chamber.

18. The method of fabricating according to claim 14, a vacuum chamber being used to reduce the ambience pressure after the overlaying, and to restore the ambience pressure to the atmospheric pressure after the coating.

19. The method of fabricating according to claim 13, the sealing material being forcibly coated under normal pressure.

20. The seal coating mask according to claim 1, the clearance being about 0.05 to 0.3 mm.

21. In combination, the seal coating mask according to claim 1 and a wiring board.

* * * * *